United States Patent [19]

Landau

[11] Patent Number: 4,844,981
[45] Date of Patent: Jul. 4, 1989

[54] ADHESION PROMOTER FOR PRINTED CIRCUITS

[75] Inventor: Adela Landau, Watertown, Conn.

[73] Assignee: MacDermid, Incorporated, Waterbury, Conn.

[21] Appl. No.: 32,953

[22] Filed: Mar. 31, 1987

Related U.S. Application Data

[60] Continuation of Ser. No. 513,759, Jul. 14, 1983, abandoned, Division of Ser. No. 365,645, Apr. 5, 1982, Pat. No. 4,409,037.

[51] Int. Cl.$^4$ ............................................. B32B 27/38
[52] U.S. Cl. .................................. 428/413; 428/469; 428/901
[58] Field of Search ........................ 428/413, 469, 901

[56] References Cited

U.S. PATENT DOCUMENTS 2,852,241  9/1958  Bergstedt ...................... 148/6.14 R
3,434,889  3/1969  Haroldson et al. ............ 148/6.14 R Primary Examiner—Sam Silverberg
Attorney, Agent, or Firm—St. Onge Steward Johnston & Reens

[57] ABSTRACT

It is among the principal objects of invention to provide a composition and a method for improving the adhesion between a copper foil and a printed circuit substrate by the provision of an adhesion promoting copper oxide layer on the copper film.

The provision of copper oxide layers on the surface of copper films by immersion in a chlorite-hydroxide bath as conventionally conducted presents problems of safety and reproducibility. This process is improved by employing an oxidizing solution containing an alkali or alkaline earth metal chlorite at a concentration of from 100 grams per liter to complete saturation, and sodium or potassium hydroxide at a concentration of from 5 to 25 grams per liter. The process preferably forms an adhesion improving copper oxide film within commercially practical periods of time, on the order of 7 minutes or less, at practically low temperatures, on the order of from 80° F. to 200° F., and preferably less than about 140° F. The solution can be sprayed by conventional spray etchers.

The copper oxide films produced according to the most preferred conditions are brown in coloration and provide adhesion values according to the standard peel test of greater than about 5 pounds per inch with contact times of from about 3 to about 5 minutes.

4 Claims, 1 Drawing Sheet

7500 X

4000 X  45°

4,844,981

ADHESION PROMOTER FOR PRINTED CIRCUITS

This is a continuation of co-pending application Ser. No. 06/513,759 filed on July 14, 1983 now abandoned, which was a division of U.S. Ser. No. 365,645 filed on Apr. 5, 1982, now U.S. Pat. No. 4,409,037

Technical Field

The present invention relates to printed circuits, and particularly to improving the adhesion between copper foil and a polymeric substrate.

Printed circuit boards are typically constructed with a polymeric substrate such as a phenolic, epoxy, polyimide, polyester, or like other resin, upon which is bonded a copper foil which is etched to provide a conductor in the desired configuration. Copper, like other pure metals, generally exhibits poor adhesion characteristics for bonding to polymers, and intermediate conversion coatings are frequently helpful. Familiar examples of this practice are the various pre-paint treatments, such as phosphate on steel, chromate on zinc or aluminum, and anodic oxide on aluminum.

For printed circuits, it is typical to employ copper oxide as the adhesion improving coating; however, the known methods for achieving the copper oxide coatings involve the use of highly corrosive chemicals which become even more dangerous at the elevated temperatures typically employed for processing. Moreover, the improvement in adhesion achieved through the use of known technology has been erratic. In fact, adhesion after treatment is sometimes no better than for clean copper.

In view of these difficulties, the question arises as to why use copper oxide at all when clean etched copper alone will give peel strengths of two to three pounds per inch. However, it is known that copper is a reactive metal and can react with the components or decomposition products of the polymer substrate. For instance, copper can compete for the amine curing agents in epoxy resins. These chemical and physical processes, aggravated by thermal cycling, can continue for the life of the assembly and lead to ultimate failure in service. An oxide coating serves as a diffusion barrier to prevent these reactions.

Accordingly, there is a present need for improvements in achieving increased bonding strength through the use of copper oxide coatings.

Background Art

In the preparation of printed circuits, a copper foil is bonded to the polymeric substrate which may be phenolic, epoxy, polyimide, polyester, or the like. Prior to bonding, the foil is normally treated electrolytically to provide a specific surface structure as disclosed in U.S. Pat. Nos. 3,293,109; 3,318,758; 3,518,168; 4,049,481; 4,131,517; 4,176,035; and others. It is believed that the copper foil on most single and two-sided printed circuit boards is so treated.

Multilayer printed circuit boards are assemblies of several two-sided boards further bonded to each other through layers of semicured polymeric material which are subsequently cured at elevated temperatures and pressures to form the complete assembly. Prior to this assembly, the copper foil of the two-sided boards is imaged and etched to from the inner layer circuits. The opposite side of the conductor patterns must then be treated for adhesion to the layer of polymer bonding one board to another. Because the etched conductors have no continuity for electrolysis, it is necessary to treat them chemically.

Copper oxide is the most useful chemical conversion coating for copper adhesion and has so been used since the early days of printed circuit technology. The basic patent in this field appears to be U.S. Pat. No. 2,364,993, which discloses the use of sodium chlorite and sodium hydroxide at high concentrations and temperatures near boiling. Similar disclosures appear in other patents, such as U.S. Pat. Nos. 2,460,896, 2,460,898, and U.S. Pat. No. 2,481,854, which have been granted to the same assignee. These four related patents teach the use of a treatment solution containing caustic in an amount which equals or exceeds the chlorite. The concentration range disclosed is from five grams per liter of chlorite and ten grams per liter of caustic on the low side, to solutions saturated with chlorite and containing one thousand grams per liter of caustic. It is indicated that the lower range will blacken copper in thirty minutes at 216° F., while the higher range will do the same in one minute at 250° F. An intermediate composition containing 150 grams per liter of chlorite and 150 grams per liter of caustic is disclosed in U.S. Pat. No. 2,364,993 to blacken the copper surface in five minutes at 200° F.

While these patents appear to be directed toward decorative applications, as well as non-reflective coatings for the interior surfaces of optical instruments, the same principles have been applied to the treatment of copper foils for use in preparing printed circuits. Some exemplary patents applying this technology to printed circuit adhesion are: U.S. Pat. Nos. 2,955,974; 3,177,103; 3,198,672; 3,240,662; 3,374,129; and U.S. Pat. No. 3,481,777. Other known means for providing copper oxide coatings include oxidation with alkaline permanganate as disclosed in U.S. Pat. No. 3,544,389, hydrogen peroxide as disclosed in U.S. Pat. No. 3,434,889, and even air at elevated temperature as disclosed in U.S. Pat. No. 3,677,828.

It is known that these oxide coatings are erratic and too frequently provide surprisingly poor adhesion, sometimes less than clean copper. A part of this problem may be that the oxide coatings are often too thick—presumably because it was thought that thicker coatings were better because of increased specific surface area. In actual fact, a thick oxide is inferior as an adhesion promoter because it is mechanically weak and may not be homogeneous.

A thick coating of oxide tends to be fuzzy and velvety, making it mechanically weak. Black powder can be wiped off with a finger. FIG. 1 shows the open fibrous structure of such a surface. During the multilayer processing operation at a high temperature and pressure, the fibers can be crushed and partially encapsulated by the flowing polymer. This means that the bond can break within the oxide layer, causing a cohesive, rather than adhesive, failure. The so-called "oxide transfer", seen as a dark stain occasionally appearing within the epoxy surface after etching away the copper, is a manifestation of encapsulated oxide fibers.

Further, a thick black oxide may not be homogeneous. Whereas the outer surface will be cupric oxide, there will be a gradient through the thickness which will be increasingly richer in cuprous oxide. This is an unstable species which can be oxidized to cupric oxide during the high temperature pressing operation by combining with residual oxygen, water or various decomposition products. The result of this reaction is a change in volume, a breaking away of points of attachment, and the creation of micro-voids which lead to poor adhesion.

In recent years, the industry has been moving in the direction of thinner oxides by dilution of the conventional chlorite-caustic baths and shortening the immersion time as described in "Electronic Packaging and Production", 18(3), 69–78 (1978). This diluted solution still requires a high temperature in the near-boiling range to dehydrate any cupric hydroxide which may form. The hydroxide, white to gray in color, is another unstable entity which can also undergo shrinkage in volume and loss of adhesion during subsequent thermal operations. And, these solutions remain troublesome from a corrosion standpoint in view of the high temperatures required. As recently as October 1981, an all-stainless steel apparatus was described using this chemistry at 190° F. ("Printed Circuit Fabrication", October 1981, p. 46–50). However, concern was expressed at the corrosion of stainless steel in the welded areas under these conditions.

In view of these difficulties, it would be desirable to provide a thermally-stable oxide coating on copper to enhance its adhesion characteristics to polymers. Additionally, it would be desirable to provide a solution capable of forming such an oxide coating which was sprayable in conventional spray equipment, such as that typically employed for spray etching printed circuit boards to enable increased productivity in continuous, conveyorized applications. And, it would be desirable to provide a composition and a process for forming oxide coatings on copper which could be operated at concentrations and temperatures below about 140° F.

Disclosure of the Invention

In accordance with the invention, I provide a composition and process for improving the adhesion of copper foil to polymeric printed circuit substrates by oxidizing the copper bonding surface. In its broad aspects, the composition comprises an aqueous solution containing an alkali metal chlorite or alkaline earth metal chlorite at a concentration of from about 100 grams per liter to saturation, and sodium hydroxide or potassium hydroxide at a concentration of from about 5 to about 25 grams per liter. The method in its broad aspect comprises: cleaning the surface of a copper foil, and immersing the foil in a solution as defined above at a temperature within the range of from about 80° to about 200° F. for a period of time effective to form an oxide layer on the surface of the copper foil capable of increasing its adhesion to a polymer substrate.

The composition and the process according to the invention provide a significant advance over the prior art procedures such as those taught in U.S. Pat. No. 2,364,993, in that it has been found that highly consistent results in terms of improved adhesion can be achieved at moderate temperatures, at commercially-efficient production rates, and at low concentrations of caustic, where the concentration of caustic is maintained at 25% or less of the concentration of the chlorite. Thus, according to the present invention, the relative amount of chlorite is increased while that of the caustic is decreased.

U.S. Pat. No. 2,364,993 and the three other related patents teach the use of a treatment solution containing caustic in an amount which equals or exceeds the chlorite. While the low concentrations of 5 grams per liter of chlorite and 10 grams per liter of caustic darkens the copper surface to almost black in 30 minutes of reaction at boiling (216° F.), this rate is far too slow in view of current demands for high productivity. The high concentration of saturated chlorite and 1000 grams per liter of caustic yields a thick, black, powdery coating in 1 minute at boiling (250° F.), but the coating is mechanically weak and unsatisfactory for adhesion as described above. Moreover, these high temperatures, above the boiling point of water, are extremely hazardous in a production scale operation which typically involves a tank of several hundred gallons. For example, the addition of water to replace evaporation losses could cause a strong eruption, spattering hot caustic solution to the hazard of operating personnel.

According to the present invention, however, adhesion-improving oxide layers can be obtained at moderate temperatures of within the range of from about 80° to 200° F. in commercially practical periods of time—typically, less than 10 minutes, and preferably from 1 to 7 minutes. At a preferred concentration of sodium chlorite of about 160 grams per liter and sodium hydroxide of about 10 grams per liter, a brown to bronze-colored oxide is formed at temperatures of about 85° F. The resulting coating is about 8 microinches in thickness and does not appear to change with varying time or temperature, although the adhesion value increases with increasing time and/or temperature. Coatings prepared according to the preferred embodiments of the invention will be brown, ranging from dark brown to lighter shades of brown, having a bronze hue.

The reason for the relatively constant thickness and texture is not understood. While not wishing to be bound to any specific theory, it is possible that copper, being slightly amphoteric, dissolves as the cuprate ion in a strongly alkaline solution as evidenced by the blue-colored solution during the blackening operation. The cuprate ion is unstable and soon changes to cupric oxide and precipitates. However, it is apparent that copper is continuously being dissolved, leading to a somewhat amorphous texture including cuprous oxide under a crystalline cupric oxide surface. On the other hand, the coating of the invention is completely insoluble in the lower alkalinity and emerges as a thin, completely homogeneous, adherent layer.

The caustic can be sodium hydroxide, potassium hydroxide, or a combination of the two. The chlorite however, can be either an alkali metal chlorite such as sodium or potassium chlorite, or an alkaline earth chlorite such as calcium or magnesium chlorite. Mixtures of suitable chlorites can also be employed. In addition to these materials the solution can also include phosphates and carbonates, for effects such as regulating alkalinity of the solution.

The minimum concentration of sodium chlorite has been found to be about 100 grams per liter for reliable adhesion while the upper limit is saturation. The preferred concentration will be about 160 grams per liter. The concentration range for the hydroxide is about 10 to 25 grams per liter. Lower concentrations do not develop enough adhesive strength within the constraints of a 1 to 7 minute dwell time, or more preferably a 3 to 5 minute dwell time, in a conventional spray machine. For most substrates, a level of hydroxide of about 16 grams per liter is preferred. On the other hand, it is preferred to maintain the caustic concentration below about 15 grams per liter, or preferably near 10 grams per liter, for polyimides which are somewhat alkali-sensitive.

Significantly, the ratio of hydroxide to chlorite on a weight basis should be less than 1:4, and will preferably be less than about 1:8. The most preferred ratios will be within the range of from about 1:10 to about 1:20, especially when the preferred concentrations are employed.

The maximum temperature is limited only by the temperature tolerance of the eqiupment. Most conventional polyvinyl chloride spray etchers are limited to about 140° F. and are equipped with safety devices to prevent overheating. Since safety and energy conservation are objects of the invention, it is preferred to operate at or below this level, although operation at 200° F. has been found satisfactory in steel tanks.

BRIEF DESCRIPTION OF THE DRAWINGS

The invention will be better understood and some of its advantages will become more apparent when the following detailed description is read in light of the attached drawings wherein.

BEST MODE FOR CARRYING OUT THE INVENTION

The following examples will aid in illustrating and explaining the invention by describing the best mode contemplated for performing it and comparing it to the procedures of the prior art. The examples are for illustrative purposes and are not to be taken as limiting in any regard. Unless otherwise indicated, all parts and percentages are by weight.

All of the following samples were processed in the following pre-treat and lamination cycle. Although some of the steps may be omitted by some operators in actual production, all are preferred for maximum adhesion and were performed for these tests.

1. Soak clean a 6 x 6 inch, 1 ounce copper foil in Anodex 61X (MacDermid Incorporated, Waterbury, Connecticut), 8 oz./gal., 3 minutes at 160° F.
2. Cold water rinse.
3. Etch in ammonium persulfate, 1.5lbs./gal., 3 minutes at 75° F.
4. Cold water rinse.
5. Dip in sulfuric acid, 10% by volume, 1 minute at 75° F.
6. Cold water rinse.
7. Oxide treatment as described in the following specific examples.
8. Cold water rinse.
9. Air dry.
10. Oven dry 30 minutes at 225° F.
11. Laminate to FR-4 epoxy by a conventional multilayer procedure; i.e., 400 psi at 350° F. for 45 minutes.

Following preparation, the samples are subjected to the following standard peel test: Measure the adhesion value (in pounds) of a 1 inch wide strip when pulled at a 90° angle from the substrate at a rate of 1 inch/minute.

Example 1 - (Prior art)

An oxidizing solution was prepared with 200 grams per liter sodium hydroxide and 100 grams per liter sodium chlorite. The cleaned and etched copper foil was immersed for 5 minutes at 200° F., and then rinsed and dried.

Figure 1:
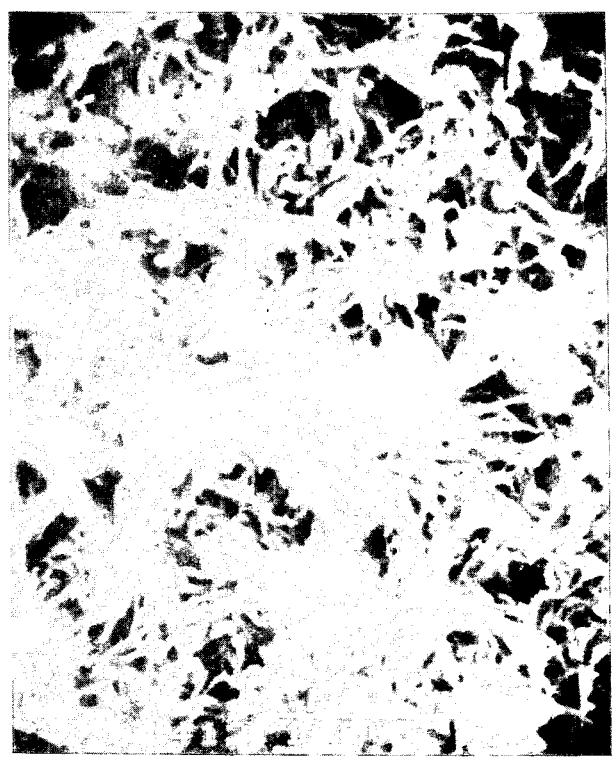
FIG. 1 is an electron-microscope-generated photograph showing the surface of an oxide coating prepared by a prior art method according to Example 1.

The appearance was black and velvet-like. Black powder could be wiped off with a finger. FIG. 1 is an electron microscope photograph of the surface. This photograph was prepared at a magnification of 7500X at 90°. (perpendicular)

When laminated to FR-4 epoxy, the peel test value was 2.0 to 2.5 pounds per inch.

Example 2 - (Prior art)

Using the same solution as in Example 1, but at 150° F., a copper foil was immersed for 10 minutes.

The appearance was dark gray with no velvet nap.
The peel test value was 2.0 to 2.25 pounds per inch.

Example 3 - (Invention)

Figure 2:
FIG. 2 is a similar photograph but at a different magnification of a coating prepared by the method of this invention as set forth in Example 3.

The oxidizing solution consisted of 160 grams per liter sodium chlorite and 10 grams per liter sodium hydroxide. The prepared copper foil was immersed for 5 minutes at 130° F. FIG. 2 is an electron microscope photograph of the surface. This photograph was prepared as that in FIG. 1, but at a magnification of 4000X at 45° angle to accentuate the surface texture.

The surface appeared golden-brown with no apparent change in surface texture.

The adhesion value was 6.5 pounds per inch.

Example 4 - (Invention)

The solution of Example 3 was used in a conventional printed circuit spray etcher (Chemcut Model 315) in a conveyorized spray mode. The dwell time was 3.25 minutes at 130° F.

The appearance of the oxide film was medium brown and the peel test value was 6.0 pounds per inch.

Examples 5-21 - (Invention)

The following examples, all immersion tank applications, demonstrate a range of parameters through which the invention is effective.

| Ex. No. | NaClO$_2$ (gm/l) | NaOH (gm/l) | Time (min) | Temp (°F.) | Peel Test (pounds/inch) |
|---|---|---|---|---|---|
| 5 | 160 | 10 | 3 | 80 | 5.0 |
| 6 | 160 | 10 | 1 | 130 | 3.5 |
| 7 | 160 | 10 | 3 | 130 | 6.25 |
| 8 | 160 | 10 | 5 | 130 | 6.25 |
| 9 | 160 | 10 | 7 | 130 | 6.25 |
| 10 | 160 | 10 | 1 | 150 | 7.25 |
| 11 | 160 | 10 | 3 | 150 | 7.25 |
| 12 | 160 | 10 | 5 | 150 | 7.75 |
| 13 | 160 | 10 | 7 | 150 | 7.50 |
| 14 | 160 | 10 | 1 | 170 | 7.75 |
| 15 | 160 | 10 | 3 | 170 | 8.00 |
| 16 | 160 | 10 | 5 | 170 | 7.25 |
| 17 | 160 | 10 | 7 | 170 | 7.50 |
| 18 | 100 | 8 | 1 | 130 | 2.50 |
| 19 | 100 | 8 | 3 | 130 | 4.50 |
| 20 | 100 | 8 | 5 | 130 | 5.50 |
| 21 | 100 | 8 | 7 | 130 | 5.75 |

It is evident that concentration, time, and temperature are interdependent variables. Therefore, an operator requiring maximum production can select a short dwell time with a proportionately higher temperature. One with temperature limitations can operate with a longer dwell time or a higher concentration.

The above description is for the purpose of teaching a person of ordinary skill in the art how to practice the invention. This description is not intended to detail all of the obvious modifications and variations of the invention which will become apparent to the skilled worker upon reading. However, it is intended that all such modifications and variations be included within the scope of the invention which is defined by the following claims.

I claim:

1. A printed circuit board having at least one copper layer laminated directly to a polymeric substrate by heat and pressure, the surface of said copper layer bonded to said substrate having been subjected, prior to lamination, to the action of an aqueous solution containing an alkali metal chlorite or alkaline earth metal chlorite at a concentration of from 100 grams per liter to complete saturation, and sodium or potassium hydroxide at a concentration of from 5 to 25 grams per liter at a temperature of from 80° F. to 200° F. for a period of time effective to form a thin, brown layer of cupric oxide on said surface.

2. A printed circuit board in accordance with claim 1 wherein the action of the aqueous solution extends for a period of time of about 1 minute at the higher end of the temperature range up to about 7 minutes at the lower end of the temperature range.

3. A printed circuit board as claimed in claim 1 wherein said printed circuit substrate is a reinforced epoxy resin board.

4. A printed circuit board as claimed in claim 1 wherein said printed circuit substrate is a reinforced polyimide resin board.

* * * * *